(12) United States Patent
Voronov et al.

(10) Patent No.: US 9,140,742 B2
(45) Date of Patent: Sep. 22, 2015

(54) METHOD OF MEASURING A SILICON THIN FILM, METHOD OF DETECTING DEFECTS IN A SILICON THIN FILM, AND SILICON THIN FILM DEFECT DETECTION DEVICE

(71) Applicant: Samsung Display Co., Ltd., Yongin-si, Gyeonggi-do (KR)

(72) Inventors: Alexander Voronov, Yongin-si (KR); Seok-Ho Lee, Yongin-si (KR); Ji-Hunny Jung, Yongin-si (KR); Kyung-Hoe Heo, Yongin-si (KR); Gyoo-Wan Han, Yongin-si (KR)

(73) Assignee: Samsung Display Co., Ltd. (KR)

( * ) Notice: Subject to any disclaimer, the term of this patent is extended or adjusted under 35 U.S.C. 154(b) by 439 days.

(21) Appl. No.: 13/766,271

(22) Filed: Feb. 13, 2013

(65) Prior Publication Data
US 2013/0265078 A1 Oct. 10, 2013

(30) Foreign Application Priority Data
Apr. 9, 2012 (KR) .......................... 10-2012-0036843

(51) Int. Cl.
*G01R 31/02* (2006.01)
*G01R 31/26* (2014.01)
*G01R 31/265* (2006.01)

(52) U.S. Cl.
CPC .............. *G01R 31/26* (2013.01); *G01R 31/265* (2013.01); *G01R 31/2648* (2013.01)

(58) Field of Classification Search
CPC ............ H01B 1/22; H01B 1/24; G01R 31/26; G01R 31/2648; G01R 31/265; G01R 27/22; G01R 27/08
See application file for complete search history.

(56) References Cited

U.S. PATENT DOCUMENTS

| 6,657,439 B1 * | 12/2003 | Harada .......................... 324/600 |
| 6,836,139 B2 | 12/2004 | Howland |
| 7,778,732 B2 | 8/2010 | Adachi et al. |
| 7,898,280 B2 | 3/2011 | Kamieniecki |
| 2002/0167322 A1 * | 11/2002 | He et al. ........................ 324/441 |

FOREIGN PATENT DOCUMENTS

| KR | 10-2010-0101259 | 9/2010 |
| KR | 10-2011-0029911 | 3/2011 |
| KR | 10-2011-0049792 | 12/2011 |

* cited by examiner

*Primary Examiner* — Tung X Nguyen
(74) *Attorney, Agent, or Firm* — Knobbe Martens Olson & Bear LLP (57) ABSTRACT

A method of measuring conductivity of a silicon thin film is provided. By the method, a capacitive sensor is positioned over a silicon thin film sample with an air-gap between the sensor and the sample, a size of the air-gap is measured using the capacitive sensor while an excitation light source module is turned off, an excitation light is illuminated on the silicon thin film sample by turning on the excitation light source module, where the excitation light is an ultraviolet light, a conductivity change of the silicon thin film sample is measured using the capacitive sensor, and a measurement error due to a deviation of the air-gap is eliminated by normalizing the conductivity change based on a measurement result of the size of the air-gap.

20 Claims, 7 Drawing Sheets

METHOD OF MEASURING A SILICON THIN FILM, METHOD OF DETECTING DEFECTS IN A SILICON THIN FILM, AND SILICON THIN FILM DEFECT DETECTION DEVICE

CROSS-REFERENCE TO RELATED APPLICATIONS

This application claims priority under 35 USC §119 to Korean Patent Application No. 10-2012-0036843, filed on Apr. 9, 2012 in the Korean Intellectual Property Office (KIPO), the content of which is incorporated herein in its entirety by reference.

BACKGROUND

Field

Example embodiments relate generally to a silicon thin film measurement technique. More particularly, embodiments of the inventive concept relate to a method of measuring a silicon thin film, a method of detecting defects in a silicon thin film, and a silicon thin film defect detection device.

SUMMARY OF CERTAIN INVENTIVE ASPECTS

Some example embodiments provide a method of measuring a silicon thin film capable of measuring a free carrier lifetime and a crystallinity of a silicon thin film using a capacitive sensor in a non-contact manner.

Some example embodiments provide a method of detecting defects in a silicon thin film capable of detecting defects in a narrow region of a silicon thin film using a capacitive sensor that includes a detection electrode, a charge pumping electrode, and a reference electrode.

Some example embodiments provide a silicon thin film defect detection device capable of detecting defects in a narrow region of a silicon thin film using a capacitive sensor that includes a detection electrode, a charge pumping electrode, and a reference electrode.

According to some example embodiments, a method of measuring conductivity of a silicon thin film may include a step of positioning a capacitive sensor over a silicon thin film sample with an air-gap between the sensor and the thin film sample, a step of measuring a size of the air-gap using the capacitive sensor by turning-off an excitation light source module, a step of illuminating an excitation light on the silicon thin film sample by turning-on the excitation light source module, the excitation light including an ultraviolet light, a step of measuring a conductivity change of the silicon thin film sample using the capacitive sensor, and a step of eliminating a measurement error due to a deviation of the air-gap by normalizing the conductivity change measured based on a measurement result of the size of the air-gap.

In example embodiments, a path on which free carriers generated by the excitation light transfer may be formed in parallel with the silicon thin film sample.

In example embodiments, a thickness of the silicon thin film sample may be between about 1 and 300 nm. In addition, the silicon thin film sample may be laminated on a dielectric substrate.

In example embodiments, the size of the air-gap may be inversely proportional to an intensity of an output signal of the capacitive sensor. In addition, a size of the measurement error due to the deviation of the air-gap may be inversely proportional to the size of the air-gap.

In example embodiments, an intensity of the excitation light may be modulated to a modulation frequency of between about 1 and 100 kHz.

In example embodiments, a resistivity of the silicon thin film sample may be calculated based on the conductivity change. In addition, the resistivity of the silicon thin film sample may correspond to a function of an inter-grain boundary potential and a free carrier lifetime.

In example embodiments, a crystallinity of the silicon thin film sample may be measured based on the resistivity of the silicon thin film sample, the crystallinity of the silicon thin film sample indicating a crystallization degree of grains included in the silicon thin film sample.

In example embodiments, the free carrier lifetime may be inversely proportional to a quantity of defects of the silicon thin film sample.

In example embodiments, the resistivity of the silicon thin film sample may be determined based on output signals of the capacitive sensor related to a plurality of silicon thin film samples, the silicon thin film samples being annealed by different laser intensities to have different crystallinities.

According to some example embodiments, a method of detecting defects in a silicon thin film may include a step of positioning a capacitive sensor over a silicon thin film sample with an air-gap between the sensor and the thin film sample, the capacitive sensor having a detection electrode, a charge pumping electrode, and a reference electrode, a step of operating the capacitive sensor, a step of measuring a quantity of residual charges that remain in the capacitive sensor by measuring a capacitance between the charge pumping electrode and the reference electrode, a step of illuminating an excitation light on a first region of the silicon thin film sample, on a second region of the silicon thin film sample, and on a junction region of the silicon thin film sample by operating an excitation light source module, the first region being placed under the charge pumping electrode, the second region being placed under the detection electrode, the junction region corresponding to a junction between the first region and the second region, a step of measuring a photoconductivity of the silicon thin film sample by measuring a quantity of transferred charges that transfer from the first region to the second region through the junction region, a step of calculating a quantity of effective charges by subtracting the quantity of the residual charges from the quantity of the transferred charges, and a step of detecting defects that exist in the junction region by analyzing the quantity of the effective charges.

In example embodiments, an external electromagnetic noise and a thermal drift of an operational amplifier may be eliminated by subtracting the quantity of the residual charges from the quantity of the transferred charges.

In example embodiments, a resolution may be improved by transferring the transferred charges from the first region to the second region through the junction region, the transferred charges being generated in the first region.

In example embodiments, the excitation light may have a laser pulse shape.

In example embodiments, the excitation light may be an ultraviolet light having a wavelength of about 385 nm.

In example embodiments, a photoconductivity of the silicon thin film sample may be proportional to energy of the laser pulse. In addition, the photoconductivity of the silicon thin film sample may be inversely proportional to a quantity of defects of the silicon thin film sample.

According to some example embodiments, a silicon thin film defect detection device may include a capacitive sensor having a charge pumping electrode, a detection electrode, and a reference electrode, the detection electrode and the reference electrode being symmetrically arranged with respect to the charge pumping electrode, and the detection electrode and the reference electrode having the same capacitance, an excitation light source module that illuminates a part of the silicon thin film sample corresponding to the charge pumping electrode, a part of the silicon thin film sample corresponding to the detection electrode, and a part of the silicon thin film sample corresponding to a junction between the charge pumping electrode and the detection electrode, an analog-to-digital converter (ADC) that receives a sensor output provided from the capacitive sensor, the sensor output indicating a quantity of charges, and a pulse generator that operates the capacitive sensor by applying a sensor driving voltage to the capacitive sensor, that activates the excitation light source module by applying a light source trigger pulse to the excitation light source module, and that activates the analog-to-digital converter by applying an ADC trigger pulse to the analog-to-digital converter.

In example embodiments, the sensor driving voltage may have a frequency of between about 10 and 1000 kHz.

In example embodiments, the sensor output may include information related to a quantity of residual charges that remain in the capacitive sensor and a quantity of transferred charges generated in the silicon thin film sample.

In example embodiments, the analog-to-digital converter may calculate a quantity of effective charges by subtracting the quantity of the residual charges from the quantity of the transferred charges.

In example embodiments, a photoconductivity of the silicon thin film sample may be calculated based on the quantity of the effective charges. In addition, defects of the silicon thin film sample may be detected based on the photoconductivity.

Therefore, a method of measuring a silicon thin film according to example embodiments may measure a free carrier lifetime and a crystallinity of the silicon thin film in a non-contact manner and in a non-destructive manner by positioning a capacitive sensor over a silicon thin film with an air-gap.

In addition, a method of detecting defects in a silicon thin film according to example embodiments may detect defects that exist in the silicon thin film by transferring free carriers to a narrow region of the silicon thin film.

Further, a silicon thin film defect detection device according to example embodiments may detect defects that exist in the silicon thin film by transferring free carriers to a narrow region of the silicon thin film.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF CERTAIN INVENTIVE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals generally refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Generally, a method of measuring a free carrier lifetime is used to inspect a quality of a thin film. According to a radio frequency (RF) wave reflection technique, the free carrier lifetime is measured based on a time during which a RF wave illuminated on the thin film comes back. However, the RF wave reflection technique measures only free carriers having a lifetime that is longer than 100 ns. In addition, the RF wave reflection technique needs to use a high power excitation laser pulse to obtain a measurable RF signal. In this case, the high power excitation laser pulse may influence a steady state free carrier lifetime. To overcome this problem, one technique consists of generating free carriers by illuminating an excitation light on a thin film, and then measuring a photoconductivity due to the free carriers. However, in this technique, the thinner the silicon thin film is, the shorter the free carrier lifetime is. Therefore, a method of measuring a free carrier lifetime in a thin silicon thin film is required.

Figure 1:
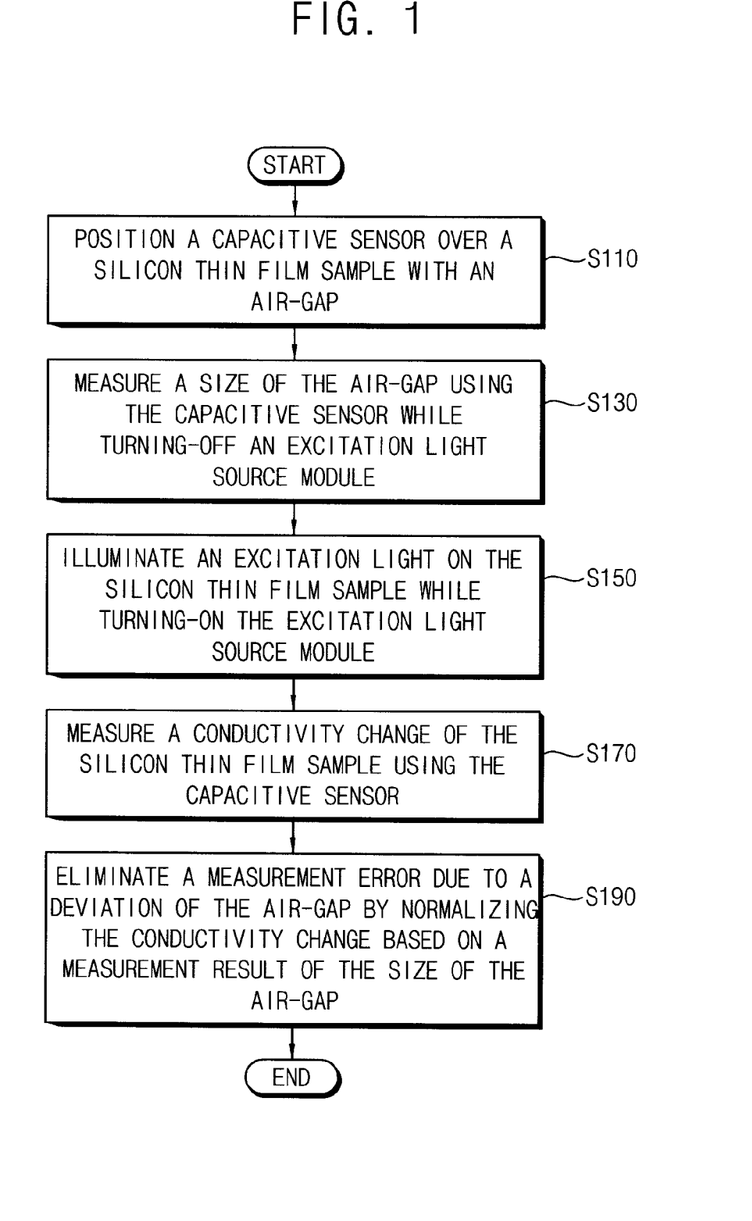
FIG. 1 is a flow chart illustrating a method of measuring a silicon thin film according to example embodiments.

FIG. 1 is a flow chart illustrating a method of measuring a silicon thin film according to example embodiments.

Referring to FIG. 1, a capacitive sensor may be positioned over a silicon thin film sample with an air-gap (S110). By the example method of FIG. 1, a quality of the silicon thin film sample may be measured in a non-contact manner and in a non-destructive manner by positioning the capacitive sensor over the silicon thin film sample with the air-gap.

Next, a size of the air-gap may be measured using the capacitive sensor (S130) while turning-off an excitation light source module. Since the excitation light source module is turned off (i.e., does not operate), free carriers may not be photo-generated in the silicon thin film sample. Thus, a conductivity may not be substantially changed, and thus the capacitive sensor may measure a size of the air-gap.

Subsequently, an excitation light may be illuminated on the silicon thin film sample while turning-on the excitation light source module (S150). Since the excitation light is illuminated on the silicon thin film sample, the free carriers may be photo-generated in the silicon thin film sample. In one example embodiment, a path on which the free carriers generated by the excitation light transfer may be formed in parallel with the silicon thin film sample. Thus, a silicon thin film having a very thin thickness, the silicon thin film being laminated on a dielectric substrate, may be measured. The method of FIG. 1 may measure a silicon thin film having a thickness of about 1 to about 300 nm.

In one example embodiment, the excitation light may be an ultraviolet light (i.e., an ultraviolet ray). Since a recombination between electrons and holes is performed on a surface of a silicon thin film, a free carrier lifetime may be relatively short. Thus, a free carrier concentration of the free carriers that are photo-generated may be very low. For example, a recombination rate may be about 20,000 cm/s on a surface of a silicon thin film having a thickness of 50 nm. In addition, a free carrier lifetime may be shorter than about 100 ps. Since a standard silicon sample (i.e., a wafer) has the free carrier lifetime in 1 us unit, the sensor output generated by measuring the silicon thin film sample may be about $10^4$ times smaller than a sensor output generated by measuring the wafer. Generally, a visible light (i.e., a visible ray) or an infrared light (i.e., an infrared ray) may be used for a photo-excitation of a silicon thin film. However, a carrier light-generation rate may be relatively low. That is, only an ultraviolet light may be easily absorbed into a thin film having a thickness of less than about 50 nm while a visible light or an infrared light are easily absorbed into a relatively thick film. For example, a silicon thin film having a thickness of 50 nm may absorb a light having a wavelength of 808 nm by less than about 1.5%. However, a silicon thin film having a thickness of 50 nm may absorb a light having a wavelength of 385 nm by about 90%. Thus, the method of FIG. 1 may measure a quality of a silicon thin film having a relatively low free carrier concentration by using an ultraviolet light as the excitation light.

In addition, in case of a semiconductor film having full attenuation characteristics, the number of excited free carriers may be defined as a function of an intensity of the light. The number of the excited free carriers may be proportional to an intensity of the light. The above description may be represented as [Expression 1]:

$$n_{freecarrier} = \gamma \frac{I_0}{\alpha}(1 - e^{-\alpha h}) \quad \text{[Expression 1]}$$

In [Expression 1], $\gamma$ indicates a carrier-generation efficiency, $I_0$ indicates an intensity of the light, $\alpha$ indicates a light absorption ratio, and h indicates a thickness of the silicon thin film. Thus, when the light absorption ratio is low, the number of the free carriers may be proportional to a thickness of the silicon thin film. When the light absorption ratio is low, the number of the free carriers may be influenced by a thickness of the silicon thin film. As a result, a measurement error due to a thickness of the silicon thin film may be caused. Thus, if an ultraviolet light having a high light absorption ratio is used as an excitation light instead of a visible light having a low light absorption ratio, or an infrared light having a low light absorption ratio, an influence by a thickness of the silicon thin film may be eliminated (or, reduced).

Next, a conductivity change of the silicon thin film sample may be measured (S170) using the capacitive sensor. In one example embodiment, a free carrier lifetime may be inversely proportional to a quantity of defects of the silicon thin film sample. Thus, when many defects exist in the silicon thin film sample, a conductivity of the silicon thin film sample may be increased relatively little.

Finally, a measurement error due to a deviation of the air-gap may be eliminated by normalizing the conductivity change of the silicon thin film sample based on a measurement result of a size of the air-gap (S190). In the method of FIG. 1, a measurement for one silicon thin film sample may be performed twice. A first measurement may be performed by measuring a size of the air-gap using the capacitive sensor when the excitation light source module turned off. A second measurement may be performed by measuring the conductivity change of the silicon thin film sample using the capacitive sensor. Since an intensity of the sensor output is inversely proportional to a size of the air-gap, the second measurement may be influenced by a deviation of the air-gap. Therefore, the method of FIG. 1 may eliminate a measurement error due to a deviation of the air-gap by normalizing the first measurement result and the second measurement result. An intensity of the sensor output according to a size of the air-gap will be described in detail with reference to FIG. 4A.

As described above, the method of FIG. 1 may measure a free carrier lifetime and a crystallinity of the silicon thin film sample. In one example embodiment, a resistivity of the silicon thin film sample may be calculated based on the conductivity change of the silicon thin film sample. A resistivity may correspond to a function of an inter-grain boundary potential and a free carrier lifetime. Thus, a crystallinity of the silicon thin film sample may be calculated based on a resistivity of the silicon thin film sample. A crystallinity of the silicon thin film sample indicates a crystallization degree of grains included in the silicon thin film sample. The above description may be represented as [Expression 2] through [Expression 4]:

$$C = \epsilon \frac{S}{d} = \frac{\sigma}{w} \cdot \frac{S}{d} \quad \text{[Expression 2]}$$

$$\sigma \propto \frac{1}{\rho} \quad \text{[Expression 3]}$$

$$C = \gamma I \tau_{free-carrier-lifetime} \frac{q^2 \tau}{mw} \cdot \frac{S}{d} \quad \text{[Expression 4]}$$

In [Expression 2], $\epsilon$ indicates a dielectric constant, S indicates an area of a cross section of the capacitive sensor, d indicates a size of the air-gap. In [Expression 3], $\sigma$ indicates a conductivity, and p indicates a resistivity. In [Expression 4], $\gamma$ indicates a carrier-generation efficiency, I indicates an intensity of the light, $\tau$ indicates a time until which an electron collides with a hole, $\tau_{free}$-carrier-lifetime indicates a free carrier lifetime, q indicates a quantity of charges, m indicates an effective mass of an electron/hole, and w indicates an excitation frequency of the capacitive sensor.

According to [Expression 4], a capacitance may be proportional to a free carrier lifetime. In addition, a capacitance may be proportional to a time until which an electron collides with a hole. When a capacitance of the silicon thin film sample is measured using the capacitive sensor, a conductivity and a resistivity of the silicon thin film sample may be calculated based on [Expression 1] and [Expression 2], and a crystallinity and a defective degree (e.g., a quantity of defects) of the silicon thin film sample may be estimated based on [Expression 4].

In one example embodiment, a resistivity may be determined based on output signals of the capacitive sensor related to a plurality of silicon thin film samples. The silicon thin film samples may be annealed by different laser intensities, and thus the silicon thin film samples may have different crystallinities.

Figure 2:
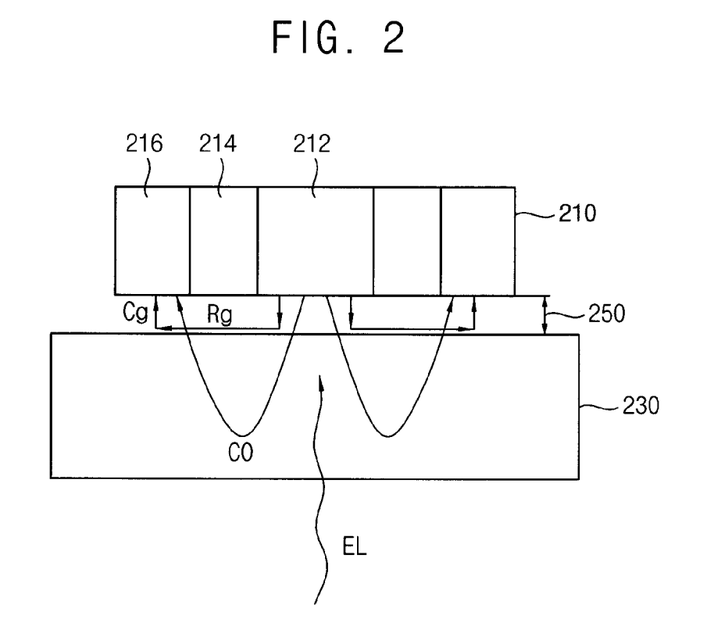
FIG. 2 is a diagram illustrating an example in which a silicon thin film is measured by a method of FIG. 1.

FIG. 2 is a diagram illustrating an example in which a silicon thin film is measured by a method of FIG. 1.

Referring to FIG. 2, a probe of the capacitive sensor 210 may be positioned over the silicon thin film sample 230 with an air-gap 250. In one example embodiment, a thickness of the silicon thin film sample 230 may be about 24 nm, and the air-gap 250 may be about 250 um. Although not illustrated in FIG. 2, the silicon thin film sample 230 may be laminated on a glass substrate having a thickness of about 0.4 m.

When an excitation light EL is illuminated on the silicon thin film sample 230 from the opposite position of the capacitive sensor 210, a plurality of free carriers may be generated in the silicon thin film sample 230. In one example embodiment, when a central electrode 212 of the capacitive sensor 210 is a positive electrode (or, a negative electrode), a side electrode 216 of the capacitive sensor 210 is a negative electrode (or, a positive electrode). A dielectric substance 214 may be placed between the central electrode 212 and the side electrode 216 in the capacitive sensor 210. For example, in the case that the central electrode 212 is a positive electrode, and the side electrode 216 is a negative electrode, an electric field may be generated in a direction from the central electrode 212 to the side electrode 216. Thus, photo-generated free carriers may be transferred on a surface of the silicon thin film sample 230 by the electric field. A current $C_g$ may be generated by the transfer of the photo-generated free carriers, and a current path $R_g$ may be formed in a parallel with the silicon thin film sample 230.

In one example embodiment, an intensity of the excitation light EL may be modulated to a modulation frequency of about 1 to about 100 kHz. The excitation light source module may output the excitation light EL having a specific waveform. The excitation light EL may have a waveform of an ultraviolet light. In addition, an intensity of the excitation light EL may be cyclically modulated. For example, an intensity of the excitation light EL may be modulated to have a form such as a pulse wave, a sine wave, a cosine wave, etc.

Figure 3:
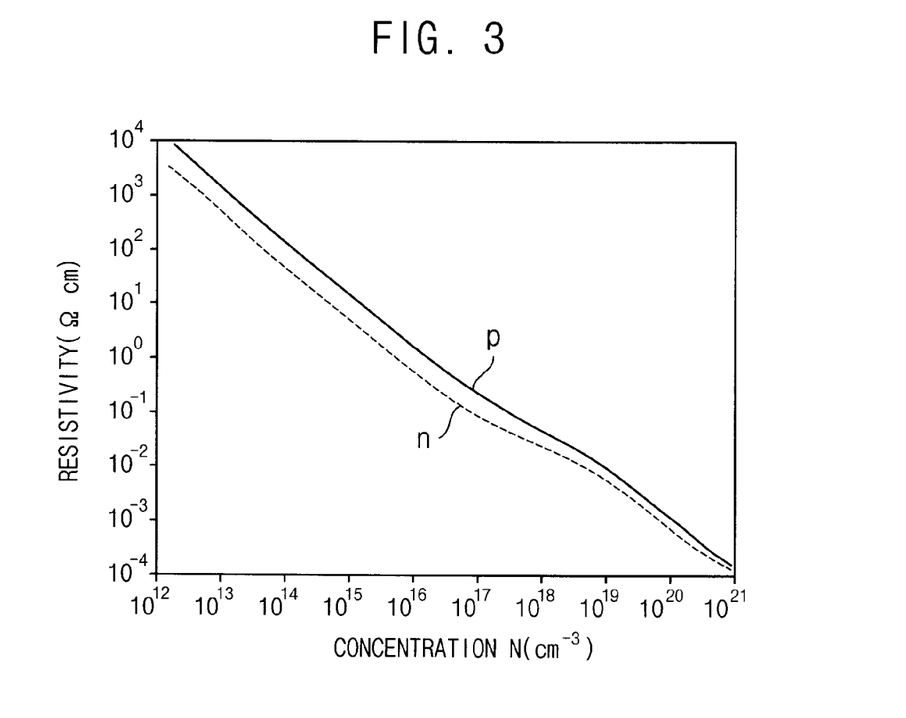
FIG. 3 is a diagram illustrating a relation between a free carrier concentration and a resistivity.

FIG. 3 is a diagram illustrating a relation between a free carrier concentration and a resistivity.

Referring to FIG. 3, it is recognized that a free carrier concentration of the silicon thin film is inversely proportional to a resistivity of the silicon thin film. Generally, a conductivity of the silicon thin film, the conductivity being inversely proportional to the resistivity of the silicon thin film, is a target factor. However, a free carrier concentration may be a more useful factor for understanding of an element. Thus, as illustrated in FIG. 2, a free carrier concentration of the silicon thin film sample 230 may be measured using the capacitive sensor 210, and the free carrier concentration may be converted into a resistivity of the silicon thin film sample 230 based on the graph of FIG. 3.

As described above, the method of FIG. 1 may measure a free carrier lifetime and a crystallinity of the silicon thin film sample 230. In one example embodiment, a resistivity of the silicon thin film sample 230 may be calculated based on the conductivity change of the silicon thin film sample 230. A resistivity may correspond to a function of an inter-grain boundary potential and a free carrier lifetime.

Figure 4A:
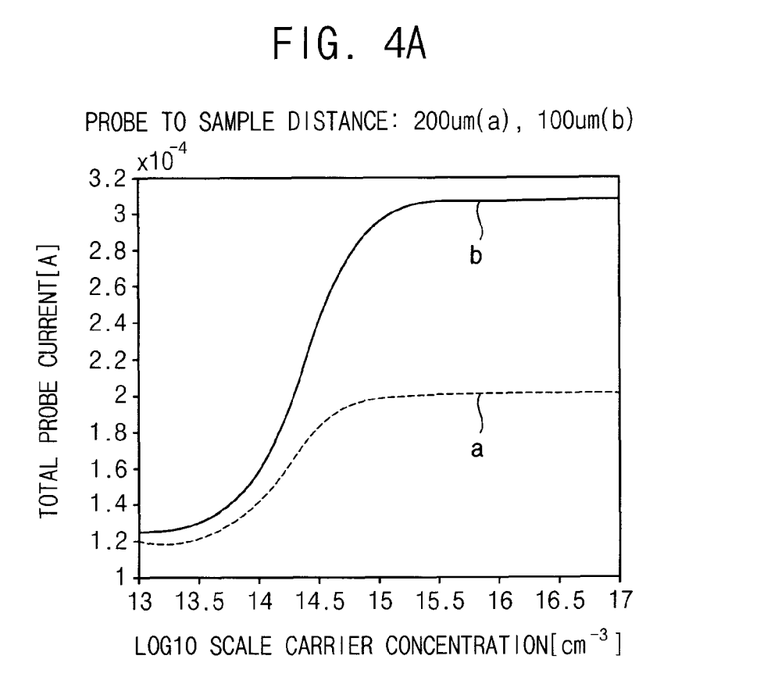
FIG. 4A is a diagram illustrating an intensity of a sensor output according to a size of an air-gap.

FIG. 4A is a diagram illustrating an intensity of a sensor output according to a size of an air-gap.

Referring to FIG. 4A, it is recognized that a size of the air-gap is inversely proportional to an intensity of the sensor output. Hence, the sensor output having a higher intensity may be obtained by reducing a size of the air-gap. However, since a measurement error due to a deviation of the air-gap is inversely proportional to a size of the air-gap, a measurement error may be increased if a size of the air-gap is reduced. According to example embodiments, a measurement error due to a deviation of the air-gap may be eliminated by measuring one silicon thin film sample twice, and by normalizing a first measurement result with the second measurement result.

Figure 4B:
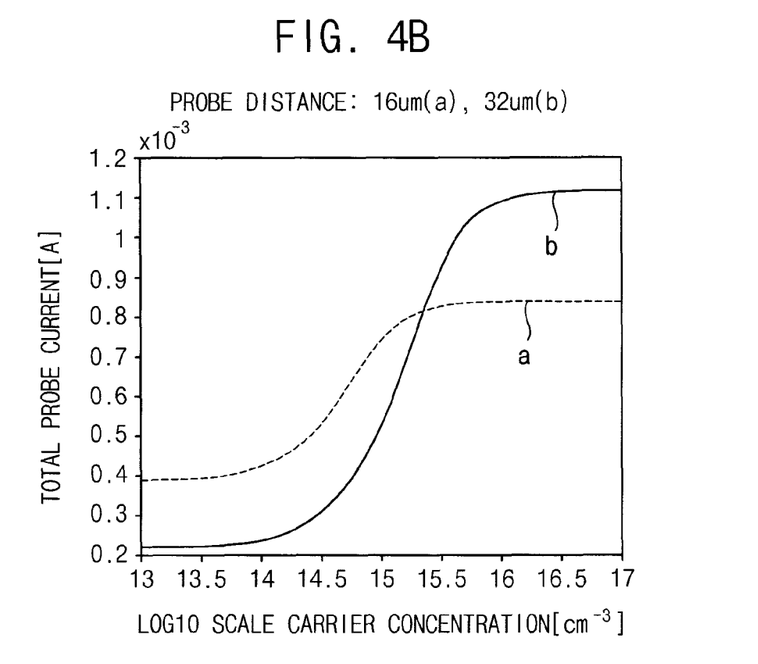
FIG. 4B is a diagram illustrating an intensity of a sensor output according to a probe diameter of a capacitive sensor.

FIG. 4B is a diagram illustrating an intensity of a sensor output according to a probe diameter of a capacitive sensor.

Referring to FIG. 4B, it is recognized that a probe diameter of the capacitive sensor is inversely proportional to an intensity of the sensor output. If a probe having a longer diameter is used, an intensity of the sensor output may be increased. In this case, a resolution of the capacitive sensor may be reduced. However, a resolution of the capacitive sensor may be improved by transferring the free carriers to a narrow region of the silicon thin film. This will be described in detail with reference to FIG. 6B.

Figure 5:
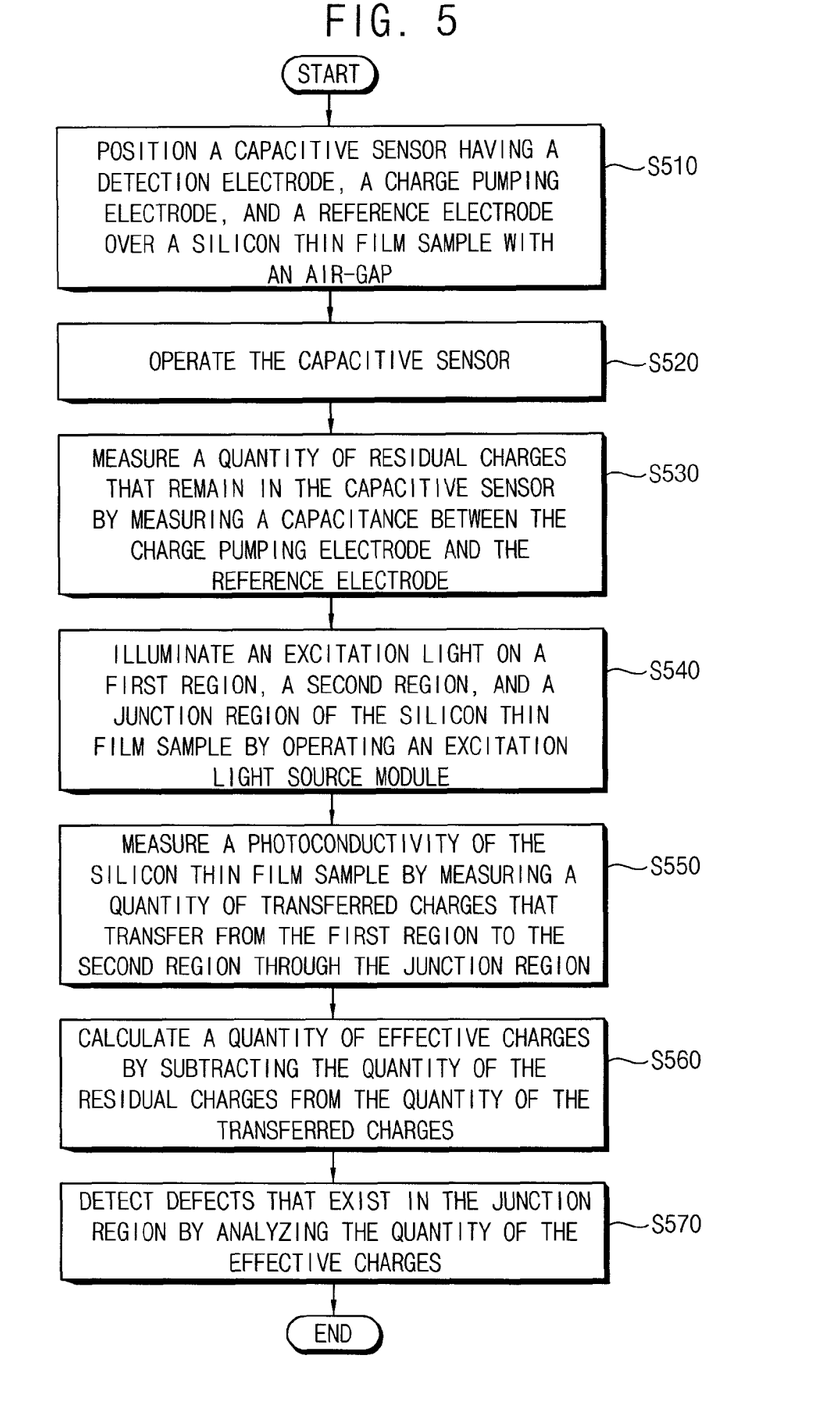
FIG. 5 is a flow chart illustrating a method of detecting defects in a silicon thin film according to example embodiments.

FIG. 5 is a flow chart illustrating a method of detecting defects in a silicon thin film according to example embodiments.

Referring to FIG. 5, a capacitive sensor having a detection electrode, a charge pumping electrode, and a reference electrode may be positioned over a silicon thin film sample with an air-gap (S510).

Subsequently, the capacitive sensor may be operated (S520). A quantity of residual charges that remain in the capacitive sensor may be measured by measuring a capacitance between the charge pumping electrode and the reference electrode (S530). The method of FIG. 5 may measure a photoconductivity of the silicon thin film sample by measuring a quantity change of charges. The residual charges may remain in the capacitive sensor before the free carriers are photo-generated. In addition, the residual charges may cause a measurement error. Thus, the measurement error may be eliminated by subtracting the quantity of the residual charges from the quantity change of charges.

An excitation light may be illuminated on a first region of the silicon thin film sample, a second region of the silicon thin film sample, and a junction region of the silicon thin film sample (S540). The first region is placed under a charge pumping electrode. The second region is placed under a detection electrode. The junction region is placed between the first region and the second region. An illumination of the excitation light will be described with reference to FIGS. 6A and 6B.

Then, a photoconductivity of the silicon thin film sample can be measured by measuring a quantity of transferred charges that transfers from the first region to the second region through the junction region (S550). Next, a quantity of effective charges can be calculated by subtracting the quantity of the residual charges from the quantity of the transferred charges (S560). Finally, defects that exist in the junction region can be detected by analyzing a quantity of the effective charges (S570).

Figure 6A:
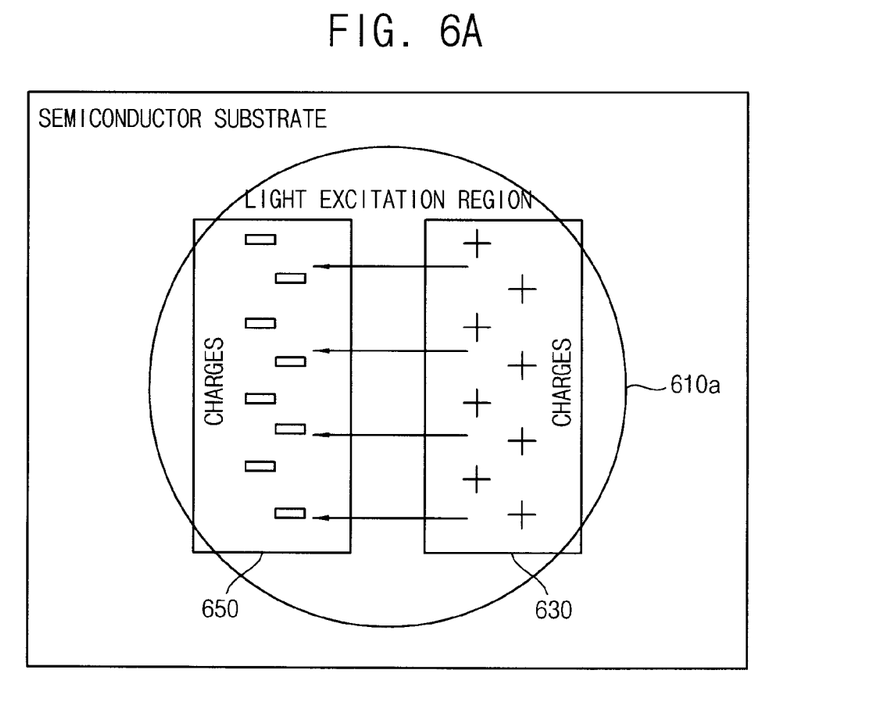
FIG. 6A is a diagram illustrating an operation of a capacitive sensor of a normal illumination manner.
Figure 6B:
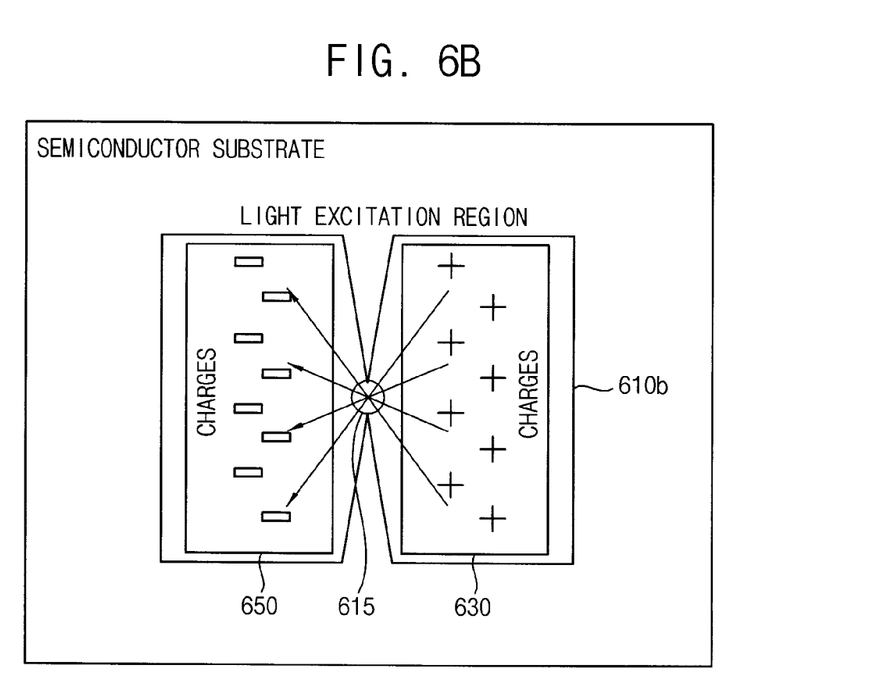
FIG. 6B is a diagram illustrating an operation of a capacitive sensor of a concentration illumination manner according to example embodiments.

FIG. 6A is a diagram illustrating an operation of a capacitive sensor of a normal illumination manner. FIG. 6B is a diagram illustrating an operation of a capacitive sensor of a concentration illumination manner according to example embodiments.

Referring to FIG. 6A, a light excitation region 610a may be formed in a circle on a silicon thin film sample. Thus, the free carriers may be photo-generated in the light excitation region 610a. A capacitive sensor may be positioned over the light excitation region 610a with an air-gap. The capacitive sensor may include a first electrode 630 and a second electrode 650. The photo-generated free carriers may be transferred from a first region of the silicon thin film sample to a second region of the silicon thin film sample. The first region may be placed under the first electrode 630, and the second region may be placed under the second electrode 650.

Referring to FIG. 6B, an excitation light may be illuminated only on a first region that is placed under the first electrode 630, only on a second region that is placed under the second electrode 650, and only on a junction region 615 of the silicon thin film sample between the first region and the second region. As a result, the light excitation region 610b may be symmetrically formed with respect to the junction region 615. For this, a filter having the same shape as the light excitation region 610b may be positioned (e.g., attached) between an excitation light source module and the silicon thin film sample. The free carriers may be photo-generated according to the light excitation region 610b. The free carriers photo-generated in the first region may be transferred to the second region through the junction region 615. An area of the first electrode 630 and an area of the second electrode 650 illustrated in FIG. 6A are the same as an area of the first electrode 630 and an area of the second electrode 650 illustrated in FIG. 6B. In addition, the first region and the second region illustrated in FIG. 6A are the same as the first region and the second region illustrated in FIG. 6B. Hence, a quantity of charges corresponding to total free carriers that transfers from the first region to the second region in FIG. 6A may be the same as a quantity of charges corresponding to total free carriers that transfers from the first region to the second region in FIG. 6B. In FIGS. 6A and 6B, a quantity of charges corresponding to total free carriers is indicated as the number of arrows. Therefore, a concentration illumination manner of FIG. 6B may improve a resolution because a large number of free carriers are transferred through the junction region 615. By a concentration illumination manner of FIG. 6B, defects that exist in the junction region 615 may be accurately detected with a high resolution.

In one example embodiment, an external electromagnetic noise and a thermal drift of an operational amplifier included in the capacitive sensor may be eliminated by subtracting the quantity of the residual charges from the quantity of the transferred charges. As a result, a measurement error may be eliminated, and thus a measurement accuracy may be improved by a concentration illumination manner of FIG. 6B.

In one example embodiment, the excitation light may have a laser pulse shape. For example, the excitation light may be an ultraviolet light having a wavelength of 385 nm. A photoconductivity of the silicon thin film sample may be proportional to energy of the laser pulse. Thus, if an ultraviolet light having relatively high energy is used, the sensor output may be improved. In addition, a photoconductivity of the silicon thin film sample may be inversely proportional to a quantity of defects of the silicon thin film sample. As a result, the defects of the silicon thin film sample may be detected by measuring the photoconductivity of the silicon thin film sample.

Figure 7:
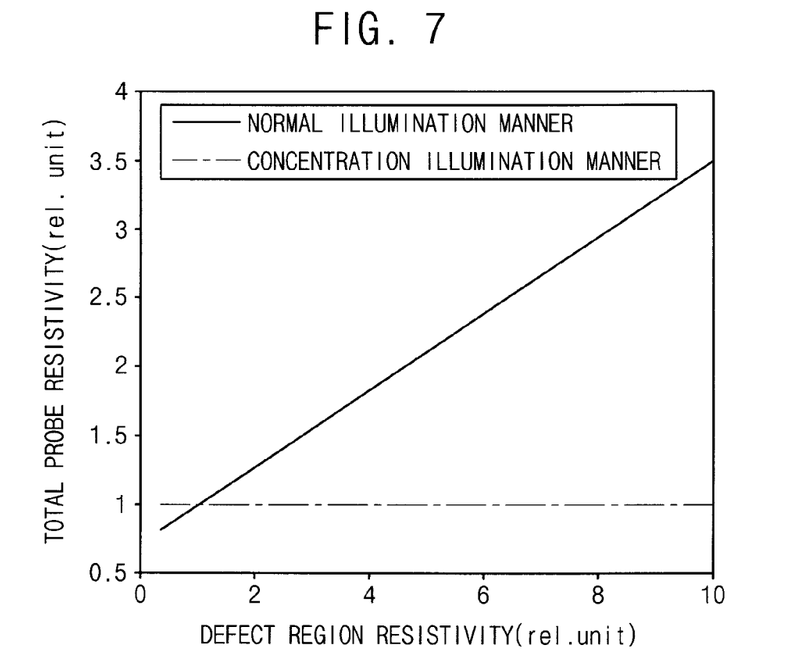
FIG. 7 is a diagram illustrating measuring performances of capacitive sensors of FIGS. 6A and 6B.

FIG. 7 is a diagram illustrating measuring performances of capacitive sensors of FIGS. 6A and 6B. An experimental example will be described with reference to FIGS. 6A, 6B, and 7.

Referring to FIG. 7, when a defect having a size of 10 um$^2$ exists in a detection region having an area of 1 mm$^2$, the defect may be detected by the capacitive sensor of the normal illumination manner or by the capacitive sensor of the concentration illumination manner. Generally, a photoconductivity may be reduced twice (i.e., a resistivity may be increased twice) when the defect having a size of 10 um$^2$ exists in a detection region having an area of 1 mm$^2$. As illustrated in FIG. 7, the capacitive sensor of the concentration illumination manner detects a resistivity change of about 30%, whereas the capacitive sensor of the normal illumination manner detects a resistivity change of about 0.01%. Thus, a detecting performance of the capacitive sensor of the concentration illumination manner is better than a detecting performance of the capacitive sensor of the normal illumination manner.

In addition, when a defect having a size of 10 um$^2$ exists in a detection region having an area of 1 mm$^2$, the capacitive sensor of the concentration illumination manner may detect the resistivity change in a linear shape. However, the capacitive sensor of the normal illumination manner may rarely detect the resistivity change.

Figure 8:
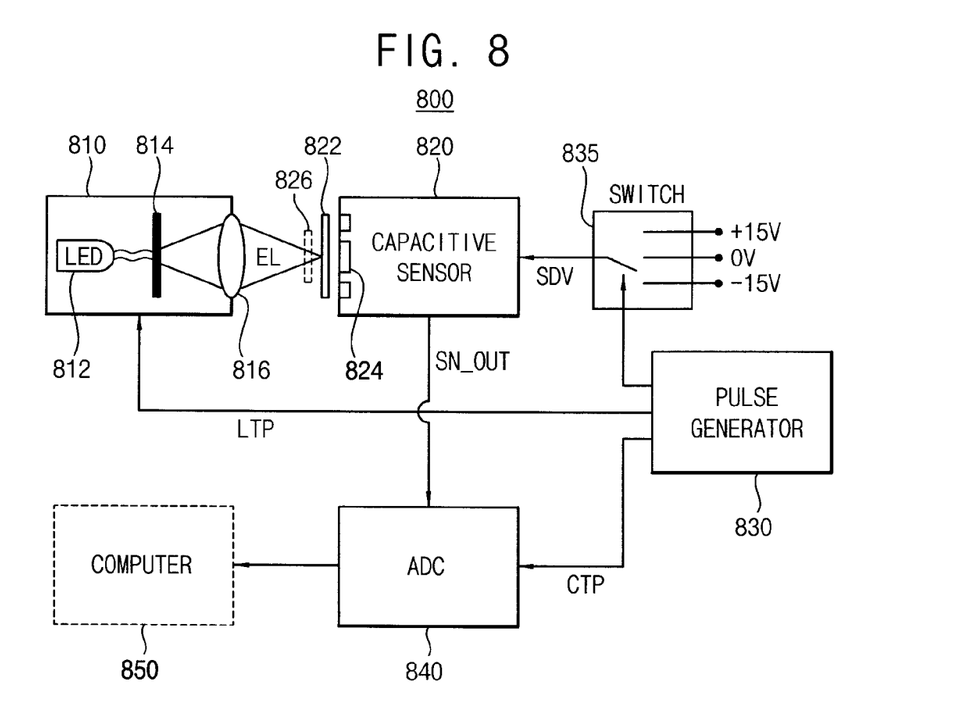
FIG. 8 is a block diagram illustrating a silicon thin film defect detection device according to example embodiments.

FIG. 8 is a block diagram illustrating a silicon thin film defect detection device according to example embodiments.

Referring to FIG. 8, the silicon thin film defect detection device 800 may include an excitation light source module 810, a capacitive sensor 820, an analog-to-digital converter (ADC) 840, and a pulse generator 830.

The capacitive sensor 820 may include a probe 824 having a charge pumping electrode, a detection electrode, and a reference electrode. The detection electrode and the reference electrode may be symmetrically arranged with respect to the charge pumping electrode. In addition, the detection electrode and the reference electrode may have the same capacitance.

The excitation light source module 810 may include a light source 812, a mask 814, and a lens 816. The light source 812 may output an excitation light EL, an intensity of the excitation light EL being cyclically modulated. For example, an intensity of the excitation light EL may be modulated to have a form such as a pulse wave, a sine wave, a cosine wave, etc. In some example embodiments, the light source 812 may correspond to a light emitting diode (LED), a laser diode, etc. The lens 816 may concentrate the excitation light EL output from the light source 812 on a silicon thin film sample 822. In some example embodiments, the lens 816 may control a divergence angle of the excitation light EL. For example, the divergence angle of the excitation light EL may be controlled by adjusting a gap between the light source 812 and the lens 816.

The excitation light source module 810 may locally illuminate the excitation light EL on the silicon thin film sample 812. The excitation light source module 810 may illuminate the excitation light EL on a part of the silicon thin film sample corresponding to the charge pumping electrode, on a part of the silicon thin film sample corresponding to the detection electrode, and on a part of the silicon thin film sample corresponding to a junction that exists between the charge pumping electrode and the detection electrode. The excitation light source module 810 may illuminate the excitation light EL according to a concentration illumination manner, the concentration illumination manner being described above with reference to FIGS. 5 and 6B. In some example embodiments, a filter 826 having the same shape as a light excitation region, the light excitation region being formed on the silicon thin film sample 822, may be positioned (e.g., attached) between the excitation light source module 810 and the silicon thin film sample 822. The excitation light EL may be input only to the light excitation region through the filter 826.

The pulse generator 830 may operate the capacitive sensor 820 by applying a sensor driving voltage SDV to the capacitive sensor 820. The pulse generator 830 may activate the excitation light source module 810 by applying a light source trigger pulse LTP to the excitation light source module 810. The pulse generator 830 may activate the analog-to-digital converter 840 by applying an ADC trigger pulse CTP to the analog-to-digital converter 840.

The analog-to-digital converter 840 may receive a sensor output SN_OUT output from the capacitive sensor 820, the sensor output SN_OUT indicating a quantity of charges. In one example embodiment, the analog-to-digital converter 840 may convert the sensor output SN_OUT into a digital signal, and may provide the digital signal to a computer 850.

Figure 9:
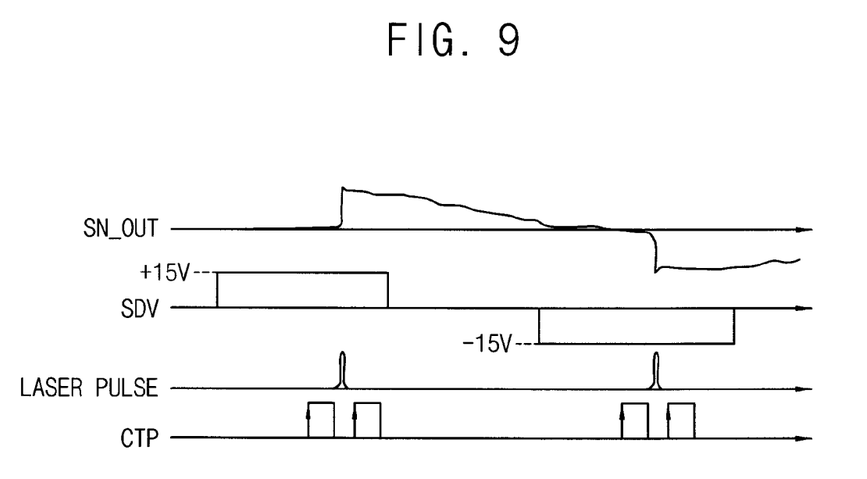
FIG. 9 is a graph illustrating an operation of a silicon thin film defect detection device of FIG. 8.

FIG. 9 is a graph illustrating an operation of a silicon thin film defect detection device of FIG. 8.

Referring to FIGS. 8 and 9, an operation of the silicon thin film defect detection device 800 will be described below. The pulse generator 830 may operate the capacitive sensor 820 by applying the sensor driving voltage SDV to the capacitive sensor 820. In one example embodiment, the sensor driving voltage SDV may have a frequency of between about 10 and about 1000 kHz. In example embodiments, the pulse generator 830 may apply the sensor driving voltage SDV having a high voltage level to the capacitive sensor 820. For example, the sensor driving voltage SDV may be about 15V. The excitation light source module 810 may be deactivated. Thus, the sensor output SN_OUT may substantially become zero by a high surface resistance of the silicon thin film sample 822. After a time delay, the sensor driving voltage SDV may be stabilized. Then, the pulse generator 830 may apply the ADC trigger pulse CTP to the analog-to-digital converter 840. The time delay may be equal to or less than about 10 us. After receiving the ADC trigger pulse CTP, the analog-to-digital converter 840 may receive the sensor output SN_OUT from the capacitive sensor 820. The sensor output SN_OUT may include information related to a quantity of residual charges that remain in the probe 824 of the capacitive sensor 820.

Next, the pulse generator 830 may operate the excitation light source module 810 by applying the light source trigger pulse LTP to it. As a result, the excitation light source module 810 may output the excitation light EL. The excitation light EL may be input to the silicon thin film sample 822 through the mask 814, the lens 816, and the filter 826. Then, a large number of free carriers may be generated in the light excitation region of the silicon thin film sample 822 corresponding to the probe 824 of the capacitive sensor 820. A quantity of charges may be changed by movements of the free carriers. The capacitive sensor 820 may output the sensor output SN_OUT to the analog-to-digital converter 840, the sensor output SN_OUT including information related to a quantity of the transferred charges.

In one example embodiment, the analog-to-digital converter 840 may obtain a quantity of effective charges by subtracting a quantity of the residual charges from a quantity of the transferred charges. In addition, the analog-to-digital converter 840 and the computer 850 may calculate a photoconductivity of the silicon thin film sample 822 based on a quantity of the effective charges, and may detect defects of the silicon thin film sample 822 based on the photoconductivity. In one example embodiment, in order to prevent overcharging of the capacitive sensor 820, the pulse generator 830 may apply the sensor driving voltage SDV having a low voltage level to the capacitive sensor 820 in a next measurement period. For example, the sensor driving voltage SDV may be about −15V.

Figure 10:
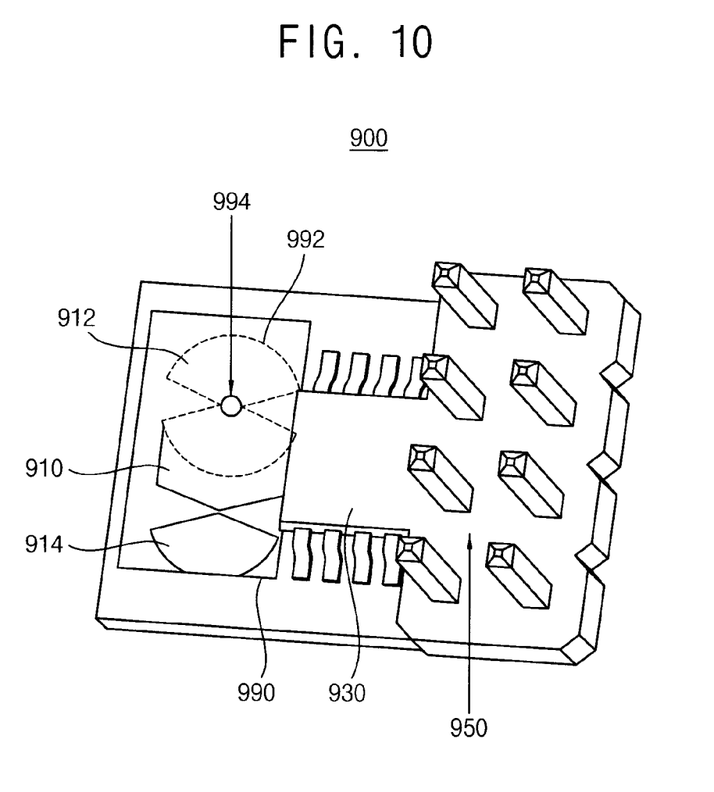
FIG. 10 is a diagram illustrating an example in which a silicon thin film defect detection device of FIG. 8 is implemented.

FIG. 10 is a diagram illustrating an example in which a silicon thin film defect detection device of FIG. 8 is implemented.

Referring to FIG. 10, a silicon thin film sample 990 may be arranged over a silicon thin film defect detection device 900 with an air-gap. In one example embodiment, the light excitation region 992 may be symmetrically formed with respect to a junction region 994. For example, the light excitation region 992 may have two fan-shapes (i.e., may have a symmetrical shape). As described above, a filter having the same shape as the light excitation region 992 may be positioned (e.g., attached) between an excitation light source module and the silicon thin film sample 990. Thus, the light excitation region 992 may be formed on the silicon thin film sample 990.

As illustrated in FIG. 10, the light excitation region 994 may be formed on a position corresponding to a part of a detection electrode 912 and a charge pumping electrode 910 of the capacitive sensor 900. In addition, a reference electrode 914 and the detection electrode 912 may be symmetrically arranged with respect to the charge pumping electrode 910. A light may not be illuminated on the reference electrode 914. The reference electrode 914 may be used for measuring the residual charges of the capacitive sensor. An operational amplifier 930 may receive and amplify a sensor output generated from the electrodes 910, 912, and 914. Next, the sensor output may be output via a connector 950 coupled to an external circuit.

The present inventive concept may be applied to a device for inspecting a quality of a semiconductor device. For example, the present inventive concept may be applied to an inspection device for detecting defects of a silicon thin film, and an inspection system for detecting defects of a silicon thin film.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of measuring conductivity of a silicon thin film, the method comprising:
    positioning a capacitive sensor over a silicon thin film sample with an air-gap between the capacitive sensor and the silicon thin film sample;
    measuring a size of the air-gap using the capacitive sensor by turning-off an excitation light source module;
    illuminating an excitation light on the silicon thin film sample by turning-on the excitation light source module, the excitation light comprising an ultraviolet light;
    measuring a conductivity change of the silicon thin film sample using the capacitive sensor; and
    eliminating a measurement error due to a deviation of the air-gap by normalizing the conductivity change measured based on a measurement result of the size of the air-gap.

2. The method of claim 1, wherein a path on which free carriers generated by the excitation light transfer is formed in parallel with the silicon thin film sample.

3. The method of claim 1, wherein a thickness of the silicon thin film sample is between about 1 and 300 nm, and the silicon thin film sample is laminated on a dielectric substrate.

4. The method of claim 1, wherein the size of the air-gap is inversely proportional to an intensity of an output signal of the capacitive sensor, and
    wherein a size of the measurement error due to the deviation of the air-gap is inversely proportional to the size of the air-gap.

5. The method of claim 1, wherein an intensity of the excitation light is modulated to a modulation frequency of between about 1 and 100 kHz.

6. The method of claim 1, wherein a resistivity of the silicon thin film sample is calculated based on the conductivity change, and
    wherein the resistivity of the silicon thin film sample corresponds to a function of an inter-grain boundary potential and a free carrier lifetime.

7. The method of claim 6, wherein a crystallinity of the silicon thin film sample is measured based on the resistivity of the silicon thin film sample, the crystallinity of the silicon thin film sample indicating a crystallization degree of grains included in the silicon thin film sample.

8. The method of claim 6, wherein the free carrier lifetime is inversely proportional to a quantity of defects of the silicon thin film sample.

9. The method of claim 6, wherein the resistivity of the silicon thin film sample is determined based on output signals of the capacitive sensor related to a plurality of silicon thin film samples, the silicon thin film samples being annealed by different laser intensities to have different crystallinities.

10. A method of detecting defects in a silicon thin film, the method comprising:
    positioning a capacitive sensor over a silicon thin film sample with an air-gap between the capacitive sensor and the silicon thin film sample, the capacitive sensor having a detection electrode, a charge pumping electrode, and a reference electrode;
    operating the capacitive sensor;
    measuring a quantity of residual charges that remain in the capacitive sensor by measuring a capacitance between the charge pumping electrode and the reference electrode;
    illuminating an excitation light on a first region of the silicon thin film sample, on a second region of the silicon thin film sample, and on a junction region of the silicon thin film sample by operating an excitation light source module, the first region being placed under the charge pumping electrode, the second region being placed under the detection electrode, the junction region corresponding to a junction between the first region and the second region;
    measuring a photoconductivity of the silicon thin film sample by measuring a quantity of transferred charges that transfer from the first region to the second region through the junction region;
    calculating a quantity of effective charges by subtracting the quantity of the residual charges from the quantity of the transferred charges; and
    detecting defects that exist in the junction region by analyzing the quantity of the effective charges.

11. The method of claim 10, wherein an external electromagnetic noise and a thermal drift of an operational amplifier are eliminated by subtracting the quantity of the residual charges from the quantity of the transferred charges.

12. The method of claim 10, wherein a resolution is improved by transferring the transferred charges from the first region to the second region through the junction region, the transferred charges being generated in the first region.

13. The method of claim 10, wherein the excitation light has a laser pulse shape.

14. The method of claim 10, wherein the excitation light is an ultraviolet light having a wavelength of about 385 nm.

15. The method of claim 10, wherein a photoconductivity of the silicon thin film sample is proportional to energy of the laser pulse, and
    wherein the photoconductivity of the silicon thin film sample is inversely proportional to a quantity of defects of the silicon thin film sample.

16. A silicon thin film defect detection device comprising:
    a capacitive sensor having a charge pumping electrode, a detection electrode, and a reference electrode, the detection electrode and the reference electrode being symmetrically arranged with respect to the charge pumping electrode, and the detection electrode and the reference electrode having the same capacitance;
    an excitation light source module configured to illuminate a part of the silicon thin film sample corresponding to the charge pumping electrode, a part of the silicon thin film sample corresponding to the detection electrode, and a part of the silicon thin film sample corresponding to a junction between the charge pumping electrode and the detection electrode;
    an analog-to-digital converter (ADC) configured to receive a sensor output provided from the capacitive sensor, the sensor output indicating a quantity of charges; and
    a pulse generator configured to:

operate the capacitive sensor by applying a sensor driving voltage to the capacitive sensor, activate the excitation light source module by applying a light source trigger pulse to the excitation light source module, and activate the analog-to-digital converter by applying an ADC trigger pulse to the analog-to-digital converter.

17. The device of claim 16, wherein the sensor driving voltage has a frequency of between about 10 and 1000 kHz.

18. The device of claim 16, wherein the sensor output includes information related to a quantity of residual charges that remain in the capacitive sensor and a quantity of transferred charges generated in the silicon thin film sample.

19. The device of claim 16, wherein the analog-to-digital converter calculates a quantity of effective charges by subtracting the quantity of the residual charges from the quantity of the transferred charges.

20. The device of claim 16, wherein a photoconductivity of the silicon thin film sample is calculated based on the quantity of the effective charges, and wherein defects of the silicon thin film sample are detected based on the photoconductivity.

* * * * *